United States Patent
Adel et al.

(10) Patent No.: US 7,557,921 B1
(45) Date of Patent: Jul. 7, 2009

(54) APPARATUS AND METHODS FOR OPTICALLY MONITORING THE FIDELITY OF PATTERNS PRODUCED BY PHOTOLITHOGRAPHIC TOOLS

(75) Inventors: Michael E. Adel, Zichron Ya'akov (IL); Moshe Preil, Sunnyvale, CA (US); Kevin Monahan, Cupertino, CA (US); Christopher F. Bevis, Los Gatos, CA (US); Ben Tsai, Saratoga, CA (US); Mark Ghinovker, Migdel Ha'Emek (IL)

(73) Assignee: KLA-Tencor Technologies Corporation, Milpitas, CA (US)

( * ) Notice: Subject to any disclaimer, the term of this patent is extended or adjusted under 35 U.S.C. 154(b) by 561 days.

(21) Appl. No.: 11/250,119

(22) Filed: Oct. 12, 2005

Related U.S. Application Data

(60) Provisional application No. 60/643,983, filed on Jan. 14, 2005.

(51) Int. Cl.
*G01B 11/00* (2006.01)
*G06K 9/00* (2006.01)
*G03C 5/00* (2006.01)

(52) U.S. Cl. .......................... 356/401; 382/151; 430/30

(58) Field of Classification Search .................. None
See application file for complete search history.

(56) References Cited

U.S. PATENT DOCUMENTS

| | | | |
|---|---|---|---|
| D255,478 S | 6/1980 | Chambers | |
| 4,251,160 A | 2/1981 | Bouwhuis et al. | |
| 4,475,811 A | 10/1984 | Brunner | |
| 4,538,105 A | 8/1985 | Ausschnitt | |
| 4,703,434 A | 10/1987 | Brunner | |
| 4,714,874 A | 12/1987 | Morris et al. | |
| 4,757,207 A | 7/1988 | Chappelow et al. | |
| 4,757,707 A | 7/1988 | Harvey et al. | |
| 4,778,275 A | 10/1988 | van den Brink et al. | |

(Continued)

FOREIGN PATENT DOCUMENTS

EP 0818814 1/1998

(Continued)

OTHER PUBLICATIONS

U.S. 5,841,144, Nov. 1998, Cresswell (withdrawn).

(Continued)

*Primary Examiner*—Gregory J Toatley, Jr.
*Assistant Examiner*—Gordon J Stock, Jr.
(74) *Attorney, Agent, or Firm*—Weaver Austin Villeneuve & Sampson LLP

(57) ABSTRACT

Disclosed are apparatus and methods for monitoring a characteristic associated with a product feature on a semiconductor product. A proxy target formed from at least one substructure that corresponds to a product feature is provided. The substructure is not individually resolvable by an optical tool. A characteristic of the proxy target is determined based on optically monitoring the proxy target using the optical tool. Based on the determined characteristic of the proxy target, it is then determined whether the corresponding product feature has a characteristic that is within a predetermined specification or whether a process parameter used to fabricate such product feature is within a predetermined specification. In a specific embodiment, the characteristic of the corresponding product feature includes a shape parameter and a position parameter.

14 Claims, 5 Drawing Sheets

U.S. PATENT DOCUMENTS

| | | | |
|---|---|---|---|
| 4,782,288 A | 11/1988 | Vento | |
| 4,820,055 A | 4/1989 | Muller | |
| 4,855,253 A | 8/1989 | Weber | |
| 4,929,083 A | 5/1990 | Brunner | |
| 5,017,514 A | 5/1991 | Nishimoto | |
| 5,100,237 A | 3/1992 | Wittekoek et al. | |
| 5,112,129 A | 5/1992 | Davidson et al. | |
| 5,148,214 A | 9/1992 | Ohta et al. | |
| 5,156,982 A | 10/1992 | Nagoya | |
| 5,172,190 A | 12/1992 | Kaiser | |
| 5,216,257 A | 6/1993 | Brueck et al. | |
| 5,262,258 A | 11/1993 | Yanagisawa | |
| 5,296,917 A | 3/1994 | Kusonose et al. | |
| 5,300,786 A | 4/1994 | Brunner et al. | |
| 5,383,136 A | 1/1995 | Cresswell et al. | |
| 5,414,514 A | 5/1995 | Smith et al. | |
| 5,436,097 A | 7/1995 | Norishima et al. | |
| 5,438,413 A | 8/1995 | Mazor et al. | |
| 5,439,767 A | 8/1995 | Yamashita et al. | |
| 5,477,057 A | 12/1995 | Angeley et al. | |
| 5,479,270 A | 12/1995 | Taylor | |
| 5,481,362 A | 1/1996 | van den Brink et al. | |
| 5,498,501 A | 3/1996 | Shimoda et al. | |
| 5,596,413 A | 1/1997 | Stanton et al. | |
| 5,604,819 A | 2/1997 | Barnard | |
| 5,617,340 A | 4/1997 | Cresswell et al. | |
| 5,627,083 A | 5/1997 | Tounai et al. | |
| 5,661,546 A | 8/1997 | Taniguchi | |
| 5,665,495 A | 9/1997 | Hwang | |
| 5,674,650 A | 10/1997 | Dirksen et al. | |
| 5,699,282 A | 12/1997 | Allen et al. | |
| 5,701,013 A | 12/1997 | Hsia et al. | |
| 5,702,567 A | 12/1997 | Mitsui et al. | |
| 5,703,685 A | 12/1997 | Senda et al. | |
| 5,712,707 A | 1/1998 | Ausschnitt et al. | |
| 5,757,507 A | 5/1998 | Ausschnitt et al. | |
| 5,766,809 A | 6/1998 | Bae | |
| 5,770,338 A * | 6/1998 | Lim et al. | 430/22 |
| 5,783,342 A | 7/1998 | Yamashita et al. | |
| 5,805,290 A | 9/1998 | Ausschnitt et al. | |
| 5,807,647 A | 9/1998 | Hashimoto | |
| 5,835,196 A | 11/1998 | Jackson | |
| 5,856,049 A | 1/1999 | Lee | |
| 5,857,258 A | 1/1999 | Penzes et al. | |
| 5,872,042 A | 2/1999 | Hsu et al. | |
| 5,877,036 A | 3/1999 | Kawai | |
| 5,877,861 A | 3/1999 | Ausschnitt et al. | |
| 5,902,703 A | 5/1999 | Leroux et al. | |
| 5,912,983 A | 6/1999 | Hiratsuka | |
| 5,923,041 A | 7/1999 | Cresswell et al. | |
| 5,936,738 A | 8/1999 | Liebmann et al. | |
| 5,939,226 A | 8/1999 | Tomimatu | |
| 5,949,145 A | 9/1999 | Komuro | |
| 5,960,125 A | 9/1999 | Michael et al. | |
| 5,965,309 A | 10/1999 | Ausschnitt et al. | |
| 5,968,693 A | 10/1999 | Adams | |
| 5,976,740 A | 11/1999 | Ausschnitt et al. | |
| 6,020,966 A | 2/2000 | Ausschnitt et al. | |
| 6,023,338 A | 2/2000 | Bareket | |
| 6,061,606 A | 5/2000 | Ross | |
| 6,077,756 A | 6/2000 | Lin et al. | |
| 6,079,256 A | 6/2000 | Bareket | |
| 6,084,679 A | 7/2000 | Steffan et al. | |
| 6,118,185 A | 9/2000 | Chen et al. | |
| 6,128,089 A | 10/2000 | Ausschnitt et al. | |
| 6,130,750 A | 10/2000 | Ausschnitt et al. | |
| 6,137,578 A | 10/2000 | Ausschnitt | |
| 6,140,217 A | 10/2000 | Jones et al. | |
| 6,146,910 A | 11/2000 | Cresswell et al. | |
| 6,160,622 A | 12/2000 | Dirksen et al. | |
| 6,165,656 A | 12/2000 | Tomimatu | |
| 6,384,899 B1 | 5/2002 | den Boef | |
| 6,396,569 B2 | 5/2002 | Zheng et al. | |
| 6,416,909 B1 | 7/2002 | Quek et al. | |
| 6,420,075 B1 | 7/2002 | Okamoto | |
| 6,462,818 B1 | 10/2002 | Bareket | |
| 6,486,954 B1 | 11/2002 | Mieher et al. | |
| 6,596,448 B2 | 7/2003 | Lai et al. | |
| 6,664,121 B2 | 12/2003 | Grodnesky et al. | |
| 6,710,876 B1 | 3/2004 | Nikoonahad et al. | |
| 6,730,444 B2 * | 5/2004 | Bowes | 430/5 |
| 6,734,549 B2 | 5/2004 | Takeoka et al. | |
| 6,734,971 B2 | 5/2004 | Smith et al. | |
| 6,753,120 B2 | 6/2004 | Kim | |
| 6,884,552 B2 | 4/2005 | Mieher et al. | |
| 7,009,704 B1 | 3/2006 | Nikoonahad et al. | |
| 7,068,833 B1 | 6/2006 | Ghinovker et al. | |
| 7,075,639 B2 | 7/2006 | Adel et al. | |
| 7,332,255 B2 * | 2/2008 | Yamaguchi et al. | 430/30 |
| 2001/0055720 A1 | 12/2001 | Sato et al. | |
| 2002/0018217 A1 | 2/2002 | Weber-Grabau et al. | |
| 2002/0021434 A1 | 2/2002 | Nomura et al. | |
| 2002/0197542 A1 | 12/2002 | Lai et al. | |
| 2003/0002043 A1 | 2/2003 | Abdulhalim et al. | |
| 2003/0026471 A1 | 2/2003 | Adel et al. | |
| 2003/0048458 A1 | 3/2003 | Mieher et al. | |
| 2003/0095267 A1 | 5/2003 | Mieher et al. | |
| 2003/0102440 A1 | 6/2003 | Sohn | |
| 2003/0223630 A1 | 12/2003 | Adel et al. | |
| 2004/0212796 A1 * | 10/2004 | Adel et al. | 356/237.1 |

FOREIGN PATENT DOCUMENTS

| | | |
|---|---|---|
| EP | 0947828 | 10/1999 |

OTHER PUBLICATIONS

Dirksen, et al., "Novel aberration monitor for optical lithography," Part of the SPIE Conference on Optical Microlithography XII, Santa Clara, CA Mar. 1999, SPIE vol. 3676, pp. 77-86. cited by other.

Farrar et al., "In-situ measurement of lens aberrations," Mar. 2000 Proceedings of SPIE Vo. 4000, Optical Microlithography XIII. Cited by other.

Hsu et al., "Characterizing lens distortion to overlay accuracy by using fine measurement pattern," Mar. 1999, SPIE, vol. 3677. cited by other.

Levinson et al., "Minimization of Total Overlay Errors on Product Wafers Using an Advanced Optimization Scheme," SPIE vol. 3051 (1997) p. 362-373. cited by other.

Levinson, "Lithography Process Control," Tutorial Texts in Optical Engineering, vol. TT28, Chapter 5, pp. 96-197. cited by other.

Monshouwer et al., "Method of Measuring Overlay," Overlay, pp. 94-107, Chapter 5, Jun. 27, 2002. cited by other.

Normura, "Measurement of Wave-Front Aberrations in Lithography Lenses with an Overlay Inspection Tool," Optical Review No. 8, vol. 4 (2001) p. 227-234. cited by other.

Rivera et al., "Overlay Performance on Tungsten CMP Layers Using The ATHENA Alignment System," cited by other.

Schenker et al., "Alt-PSM for 0.10um and 0.13um poly patterning," Proc. Of SPIE vol. 4000.

Optical Microlithography XIII, ed. C. Progler, Mar. 2000. cited by other.

International Search Report from International Application No. PCT/US04/12506, dated Dec. 12, 2005, cited by other.

U.S. Appl. No. 10/950,172, filed Sep. 23, 2004.

U.S. Appl. No. 10/858,836, filed Jun. 1, 2004.

* cited by examiner

APPARATUS AND METHODS FOR OPTICALLY MONITORING THE FIDELITY OF PATTERNS PRODUCED BY PHOTOLITOGRAPHIC TOOLS

CROSS REFERENCE TO RELATED PATENT APPLICATION

This application claims priority of U.S. Provisional Patent Application No. 60/643,983 filed 14 Jan. 2005 by Michael E. Adel et al., which application is incorporated herein by reference in its entirety for all purposes.

BACKGROUND OF THE INVENTION

This invention pertains to semiconductor patterning processes. More particularly, it pertains to apparatus and methods for monitoring the fidelity of patterns produced by patterning processes, such as photolithography and etching processes that are used to pattern semiconductor materials.

A typical semiconductor product device is formed from a number of product features residing and coupled together within multiple semiconductor layers. Each layer will typically include numerous product features belonging to the same or different product devices. Each layer of product features or pattern is generally formed using some type of semiconductor patterning process, such as photolithography. Each layer pattern is first formed in a photoresist material that is disposed over a particular semiconductor material. Exposure light is then passed through a mask which forms a design pattern, and the design pattern is then exposed onto the resist material forming an exposed pattern on the resist material. Subsequent development of the exposed resist pattern results in activation of such pattern so that the developed resist pattern can be used during an etching process to prevent the underlying semiconductor material from being etched away while the exposed semiconductor material is etched away, or visa versa. Thus, the semiconductor material underlying the resist pattern areas (or the areas outside the resist pattern) is patterned to form product features.

Patterning processes (e.g., photolithography) are becoming very challenging as the feature sizes go below the standard resolution limit of the patterning tool. One challenge includes achieving an accurate transfer of the design features into final patterned features. Resolution enhancement techniques (RETs) are used to achieve a smaller resolution on the patterned material (e.g., photoresist or device layer) than the actual resolution of the mask used to form the resulting pattern. Additionally, the limits of optical imaging technology as a vehicle for semiconductor patterning are being pushed. By way of example, when a 70 nm line width is to be patterned on a 200 nm pitch using an exposure tool having a Numerical Aperture NA=0.75 and wavelength of about 193 nm, the k1 factor will be related to the tool by the equation:

Minimum half pitch=$k_1 \lambda / NA$

Thus, $k_1$ will be 0.39. Under these conditions, imaging behavior is complex. As a result, the range of feature dimensions that are potentially at risk of being outside the bounds of process control and which constitute a yield risk grows rapidly as $k_1$ diminishes. Furthermore, the risks are often associated with the combined effects of pattern shifts with shape changes.

Another challenge as pattern sizes become smaller is that it is often difficult (or impossible) to measure the small features using conventional optical tools. Alternatively, a scanning electron microscopy (SEM) system can be used to analyze the integrity of the small features. However, SEM systems require a significant amount of time to load and seal the wafer into the vacuum and then to acquire the high resolution image using the SEM. Thus, it is difficult to efficiently determine whether particular feature characteristics, such as shape or location fidelity, are within specification or are likely to fail using conventional optical and SEM inspection techniques.

In light of the foregoing, improved mechanisms for monitoring feature fidelity or for monitoring the fidelity of processes for fabricating features are needed.

SUMMARY OF THE INVENTION

Accordingly, the present invention provides methods and apparatus for using a brightfield imaging tool or other type of optical tool for the purpose of monitoring the fidelity of patterned features, e.g., in a patterned photoresist or other underlying product material, or a process parameter using proxy targets. Proxy target features are used in place of particular product features or specific patterns. Each proxy target feature has some detectable characteristic which can be measured or analyzed (e.g., with brightfield imaging or scatterometry analysis) and then the results of this analysis may be used to determine the fidelity of the corresponding product feature which is not itself resolvable by the optical tool or corresponding process. In general, the assessed proxy characteristic substantially correlates with the desired characteristic of the corresponding product feature. Patterning problems associated with both the shape and the position fidelity (e.g., relative alignment with other pattern positions) of a particular product pattern may be determined by analyzing the changes in a characteristic of the corresponding proxy target.

In one embodiment, a method of monitoring a characteristic associated with a product feature on a semiconductor product is disclosed. A proxy target formed from at least one substructure that corresponds to a product feature is provided. The substructure is not individually resolvable by an optical tool. A characteristic of the proxy target is determined based on optically monitoring the proxy target using the optical tool. Based on the determined characteristic of the proxy target, it is then determined whether the corresponding product feature has a characteristic that is within a predetermined specification or whether a process parameter used to fabricate such product feature is within a predetermined specification. In a specific embodiment, the characteristic of the corresponding product feature includes a shape parameter and a position parameter.

In a specific implementation, it is determined whether the corresponding product feature has a characteristic that is within a predetermined specification based on the determined characteristic of the proxy target. The determined characteristic of the proxy target indicates whether there has been a change in size or shape of the substructure that corresponds to the product feature and it is determined whether this size or shape is within the predetermined specification. In certain aspects, the characteristic of the proxy target is obtained from performing a scatterometry technique on an optical signal emanating from the proxy target. In other aspects, the characteristic of the proxy target is obtained from an optical image of the proxy target.

In a specific embodiment, the characteristic of the proxy target is an amount of overlay error that is present between two sets of structures of the proxy target image. In a further aspect, the characteristic of the corresponding product feature is a line shortening effect, and it is determined whether the line shortening effect is within a predetermined specification when the overlay error determined for the proxy target is not within a predetermined specification. The predetermined specification of the line shortening effect corresponds to whether the corresponding product feature will likely result in a faulty device that decreases yield. In one embodiment, the proxy target includes a first set of anchor structures that have shape and position characteristics that remain substantially the same under the process for fabricating the proxy target changes and a second set of structures that are sensitive to line shortening. In a further aspect, the second set of structures each includes a plurality of periodic lines that are not individually resolvable with the optical tool and each structure that is composed of periodic lines of the second set is resolvable by the optical tool. Line shortening in any of the periodic lines affects the determined overlay error of the proxy target. In a further aspect, the second set of structures each further include a wide bar that is resolvable and is coupled to a first end of the periodic lines.

In another embodiment, the characteristic of the proxy target is an amount of shift that is present between two sets of structures of the proxy target image, and the characteristic of the corresponding product feature is a pattern placement error. It is determined whether the pattern placement error is within a predetermined specification when the shift amount determined for the proxy target is not within a predetermined specification. The predetermined specification of the pattern placement error corresponds to whether the corresponding product feature will likely result in a faulty device that decreases yield. In a further aspect, the proxy target includes a first set of anchor structures that have shape and position characteristics that remain substantially the same under the process for fabricating the proxy target changes and a second set of structures that are sensitive to pattern placement error. In yet a further aspect, the second set of structures each includes a plurality of periodic lines that are not individually resolvable with the optical tool, and each structure that is composed of periodic lines of the second set is resolvable by the optical tool. Also, pattern placement error in any of the periodic lines affects the determined shift amount of the proxy target.

In an alternative implementation, the characteristic of the corresponding product feature is a subresolution assist structure characteristic, and it is determined whether the subresolution assist structure characteristic is within a predetermined specification when the overlay error determined for the proxy target is not within a predetermined specification. The predetermined specification of the subresolution assist structure characteristic corresponds to whether the corresponding product feature will likely result in a faulty device that decreases yield. In a further aspect, the proxy target includes a first set of anchor structures that have shape and position characteristics that remain substantially the same under the process for fabricating the proxy target changes and a second set of structures that are sensitive to a subresolution assist structure error. In one aspect, the second set of structures each includes a plurality of periodic lines and a subresolution assist structure that is designed to only be present in the reticle but not the printed proxy target, and each structure that is composed of periodic lines of the second set is resolvable by the optical tool. A subresolution assist structure error in any of the periodic lines affects the determined overlay error amount of the proxy target.

In yet another embodiment, the characteristic of the corresponding product feature is a phase shift error, and it is determined whether the phase shift error is within a predetermined specification when the overlay error determined for the proxy target is not within a predetermined specification. The predetermined specification of the phase shift error corresponds to whether the corresponding product feature will likely result in a faulty device that decreases yield.

In a specific aspect, the characteristic of the proxy target is a value obtained from a harmonic analysis of at least a first and a second set of structures on the proxy target image, and the proxy target includes a first set of anchor structures that have shape and position characteristics that remain substantially the same when the process for fabricating the proxy target changes and a second set of structures are formed from one or more substructures that are not resolvable with the optical tool. Changes in a shape or position of any substructure results in a change to the characteristic of the proxy target. In one aspect, a value is obtained from a harmonic analysis by collapsing an image of the first set of structures into a first one-dimensional line and obtaining a first value for such first one-dimensional line, collapsing an image of the second set of structures into a second one-dimensional line, obtaining a second value for such second one-dimensional line, and then obtaining a difference value between the first and second values. In one implementation, the first value and the second value correspond to moment functions for the first and second one-dimensional lines, respectively.

These and other features and advantages of the present invention will be presented in more detail in the following specification of the invention and the accompanying figures which illustrate by way of example the principles of the invention.

DETAILED DESCRIPTION OF SPECIFIC EMBODIMENTS

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In general, the present invention includes techniques for monitoring the fidelity of semiconductor structures using an optical system. Optical techniques for monitoring processes for fabricating such structures are also provided. Device structures that are too small to resolve with the selected optical system are arranged as part of a larger proxy structure that can be optically monitored. In one embodiment, an array is formed form the smaller structures and the array forms a larger structure. A characteristic of the proxy structure is then monitored and correlated to a characteristic of the smaller substructures that are used to form the proxy structure (or correlated to a process characteristic). The monitored proxy characteristic is then used to determine whether the correlated characteristic of the smaller substructures (or an associated process) is within a predetermined specification. In a specific implementation, the proxy target is used to determine whether corresponding product structures are likely to have either a position or shape parameter that is out of specification.

One type of structure which can be used in the present invention is an overlay target. In brief, overlay error generally pertains to the determination of how accurately a first patterned layer aligns with respect to a second pattered layer disposed above or below it and to the determination of how accurately a first pattern aligns with respect to a second pattern disposed on the same layer. The overlay error is typically determined with an overlay target having structures formed on one or more layers of a workpiece (e.g., semiconductor wafer). The structures may be periodic or they may be based on the structures of the Box in Box and related targets. If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern.

Figure 1:
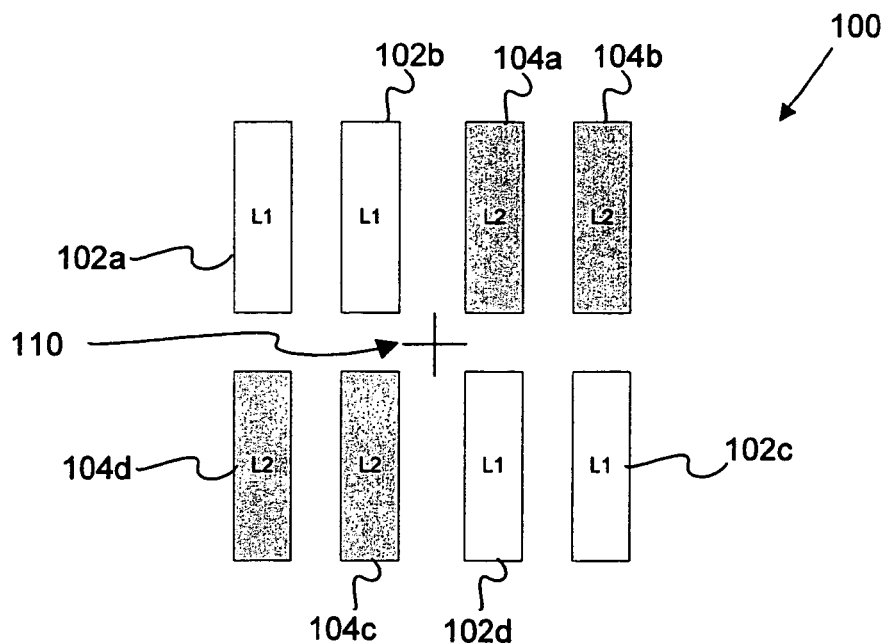
FIG. 1 is a top view illustration of a standard overlay target.

FIG. 1 is a top view illustration of a standard overlay target 100. As shown, the target 100 includes a first set of structures 102a~102d on a first layer L1 and a second set of structures 104a~104d on a second layer L2. The center of symmetry (COS) of each set of structures is measured with an optical tool. When the COS from the first set of structures 102a~102d matches the COS of the second set of structures 104a~104d, then it is determined that there is no overlay error. However, when the COS from each set differs by a predetermined amount, then it is determined that there is unacceptable misalignment present between the two sets of structures 102a-102d and 104a-104d. Accordingly, it is also determined that there is likely to be an unacceptable amount of misalignment present between other types of structures deposed on these same two layers. In the illustrated example, the COS 110 of the first and second sets of structures match.

The offset between two different layer structures may be determined in any suitable manner, such as overlay imaging or overlay scatterometry. In an imaging technique, an image of the overlay target is obtained and the COS for each structure set in each layer is obtained from the image. The examples herein are described in terms of bright field imaging although any suitable imaging technology may be implemented in a similar manner.

Alternative approaches include spectroscopic scatterometry and spectroscopic ellipsometry. Several suitable embodiments of scatterometry techniques are described further in co-pending U.S. application Ser. No. 10/785,396, entitled "APPARATUS AND METHODS FOR DETECTING OVERLAY ERRORS USING SCATTEROMETRY", filed 23 Feb. 2004 by Walter D. Mieher et al., which application is incorporated herein by reference in its entirety for all purposes. As opposed to bright field imaging based methods, these techniques rely on the inherent breaking of symmetry between spectra obtained from superimposed grating pairs. These superimposed grating pairs have by design equal and opposite offsets between the twin gratings when there is a non-zero overlay shift between two superimposed gratings from each layer. In a way analogous to imaging techniques described herein, a feature of the scatterometry target is defined so that it can be measured and converted into a displacement which induces a breaking of symmetry in the spectra between target pairs. It is expected that this method is likely to yield superior precision and sensitivity to the feature parameter under test, when compared with the bright field imaging based method but at the cost of target size and throughput.

Figure 2:
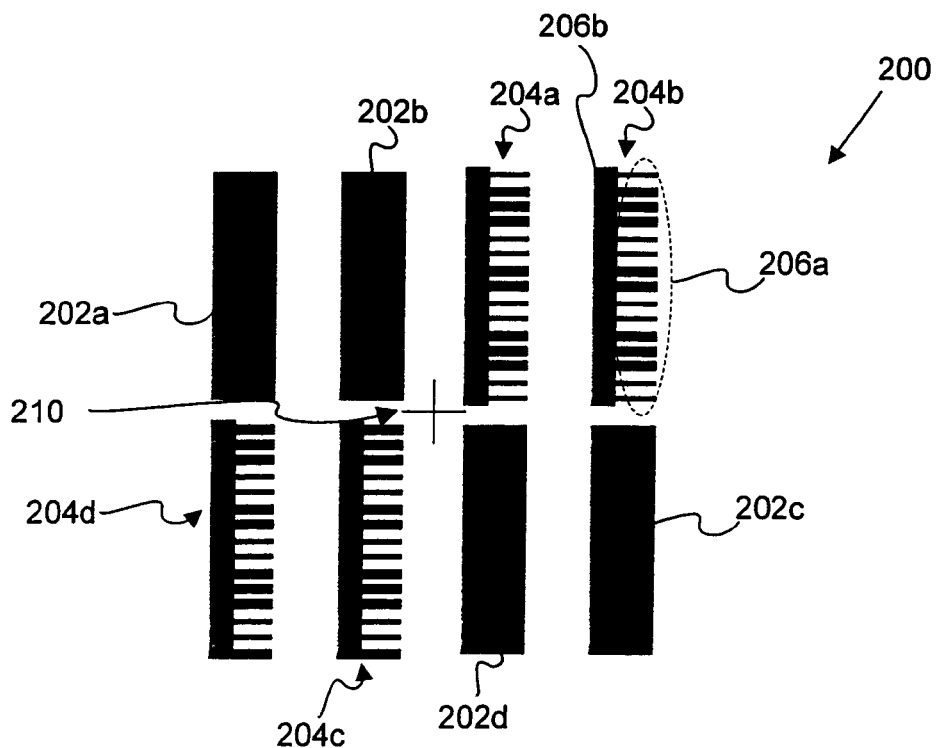
FIG. 2 is a top view diagrammatic representation of a proxy target for monitoring a line end shortening effect in accordance with a first embodiment of the present invention.

FIG. 2 is a top view diagrammatic representation of a proxy target 200 for monitoring a line end shortening effect in accordance with a first embodiment of the present invention. As shown, the target 200 includes a first set of anchor structures 202a through 202d that are designed to be fairly process robust. That is, these anchor structures 202a-202d have a size and shape (and COS) that remain substantially the same when the process changes. The target also includes a second set of structures 204a-204d that are sensitive to line shortening. The first structures 202a-202d may be printed on a same or different layer than the second set of structures 204a-204d.

As shown, the second set of structures 204a-204d each include a wide bar 206b coupled with a plurality of smaller substructures 206a. These smaller substructures 206a are not separately resolvable by the optical tool. However, the COS of the overall structures 204a-204d which include these smaller substructures 206a together with the wide bar 206b is resolvable.

In this case, the line shortening characteristic of the smaller substructures 206a affects the COS of the larger overall structures 204a-204d. Thus, the COS may be monitored to thereby monitor the line shortening effect in smaller substructures that cannot be individually resolved with the optical tool. For instance, if there is no line shortening in any of the individual smaller substructures 206a of the larger structures 204a-204d, then the COS of the larger structures 204a-204d will substantially match the COS of the process robust structures 202a-202d. In the illustrated example, the COS's 210 are shown as being perfectly overlaid. If any of the individual smaller substructures 206a of the larger structures 204a-204d are shortened, then the COS of the larger structures 204a-204d will not match the COS 210 of the other process robust structures 202a-204d.

In sum, the COS of the structures 204a-204d formed from a plurality of unresolvable substructures may be compared to the COS of process robust structures 202a-202d. The difference between the two COS may then be correlated with the line shortening characteristic of the substructures to determine whether the amount of line shortening falls within a predetermined specification. That is, if the COS difference falls within a predetermined range which correlates to a predetermined range of line shortening amounts, it may be determined that the product features are not likely to fail. Otherwise, it may be determined that the product features are likely to fail. Several suitable applications for using the overlay results are described further below.

The COS for each set of structures 204a-204d and 202a-202d may be determined using any suitable technique. For example, an edge technique may be utilized to determine COS for the structures in each layer. For the structures 204a-204d, the edges of each structure 204a~d may be determined and then the edges are then used to find a center position between the outside edges of each set of structures (e.g., between structures 204a~b and structures 204c~d). The edge of each combed structure (e.g., 206a) would be measured as a single edge. Another COS determination technique is referred to as the correlation technique. In this technique, an initial COS position is estimated between the groups of structures of each layer. As shown for the structures 204a-204d, an initial estimate of COS 210 may be positioned between structures 204a~b and structures 204c~d. Two linear arrays are then obtained by measuring across the two sets of structures at positions that are equal distances from the initial COS. The structures 204a~b and 204c~d will tend to each result in a periodic signal with two peak intensity values. The two obtained linear arrays are then flipped horizontally and vertically and matched and a metric of correlation such as the product is calculated. The arrays are moved with respect to one another and the metric is calculated for each offset. The metric is then plotted and the correct COS is located by finding the maximum of the correlation metric. Intelligent searching algorithms (e.g., a binary search) may also be used to efficiently locate the correct COS position.

Pattern placement error (PPE) generally refers to the differences in overlay between two or more devices located at two or more positions with respect to the field. In a simplified example, a relative difference may exist between the overlay error of a first structure and the overlay error of a second structure, i.e., the differences may be found and thereafter characterized relative to one another. The differences may be caused by a variety of factors including, but not limited to, aberrations in the lenses of the lithography system, distortions in the lenses of the lithography system, mechanical errors of the lithography system, errors on the reticle, and the like.

Figure 3:
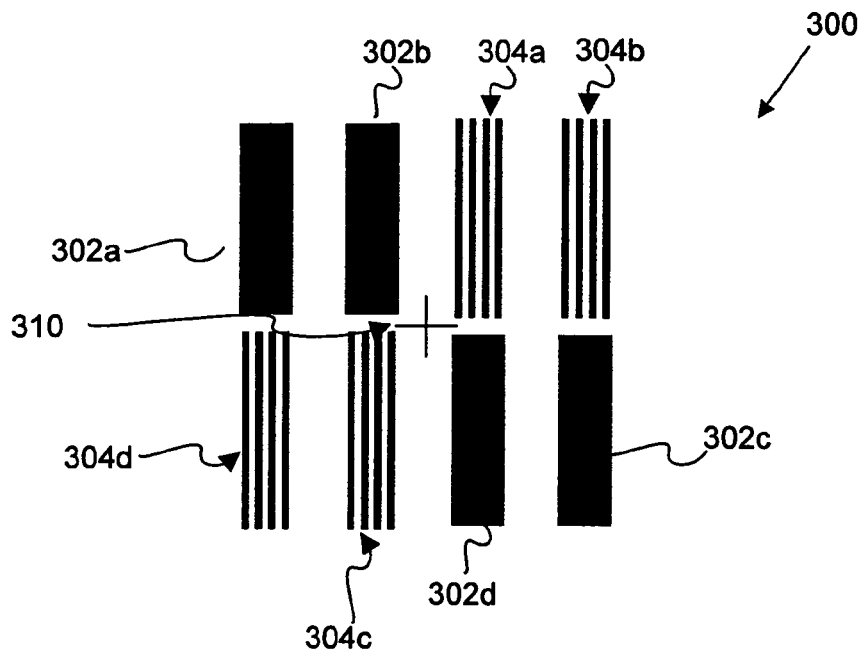
FIG. 3 is a top view diagrammatic representation of a proxy target for monitoring pattern placement error in accordance with a second embodiment of the present invention.

FIG. 3 is a top view diagrammatic representation of a proxy target 300 for monitoring PPE in accordance with a second embodiment of the present invention. In this embodiment, smaller structures 304a~304d that are not individually resolvable with the optical tool are designed to have a predetermined position relative to a set of larger structures 302a~302d. For example, the smaller structures 304a~304d are designed to have a same COM 310 as the larger structures 302a~302d. The smaller structures 304a~304d are preferably in a same layer as the larger structures 302a~302d.

The smaller structures each correspond to actual product features, e.g., are sized to be as small as design rule features, while the larger structures 302a-302b are process robust type features which are not affected substantially by process changes. However, process changes will tend to shift the set of smaller structures 304a-304d relative to the larger structures 302a-302d. Accordingly, one can monitor the relative offset between these two structures 302a-302d and 304a-304d and correlate the shift with PPE in product features. For instance, when the monitored shift amount is within a predetermined specification, it may be determined that PPE of product features is likely to be within specification and not result in faulty devices. Conversely, when the monitored shift amount is outside the predetermined specification, it may be determined that PPE of product features is likely to be outside specification and thereby result in faulty device operation.

Figure 4:
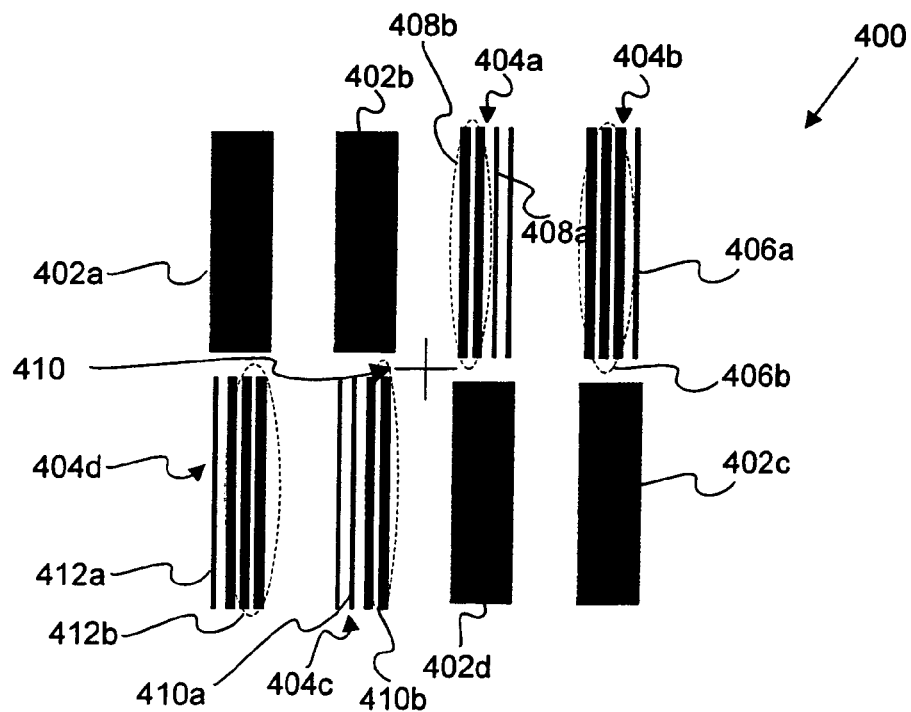
FIG. 4 is a top view diagrammatic representation of a proxy target for monitoring a subresolution assist structure (SRAF) characteristic in accordance with a third embodiment of the present invention.

FIG. 4 is a top view diagrammatic representation of a proxy target 400 for monitoring a subresolution assist structure (SRAF) characteristic in accordance with a third embodiment of the present invention. In general, SRAF structures are present on masks and are designed not to print on the final product wafer. Their purpose is to facilitate the printing of other adjacent features on the mask, e.g., to control the position of adjacent feature edges.

As shown, the SRAF proxy target 400 includes a first set of process robust features 402a-402d and a second set of SRAF structures 404a-404d. Each set of SRAF structures 404a-404d includes a plurality of printable features and at least one SRAF structure to aid in printing the printable features but are not designed to be printed. As shown, structure 404a includes two medium sized bars 408b and at least one SRAF structure 408a. Similarly, structure 404b includes three medium sized bars 406b and at least one SRAF structure 406a. Structure 404c includes two medium sized bars 410b and at least one SRAF structure 410a, while structure 404d includes three medium sized bars 412b and at least one SRAF structure 412a. By way of example, the medium sized bars are 100 nm wide, while the SRAF bar is 50 nm wide.

In the illustrated example, the target 400 is shown as it appears in the mask. When the target 400 is printed onto the semiconductor wafer, the SRAF features are designed to not print and to aid in positioning the adjacent structure (e.g., medium bars 406b, 408b, 410b, and 412b). If the position of the adjacent structure is outside specification (e.g., the SRAF fails to correctly facilitate placement) or the SRAF inadvertently prints onto the wafer, then the COS (e.g., 410) of the first and second set of structures will not match. For instance, if SRAF 406a prints, while SRAF 412a does not print, the COS of the second structures 404 will shift relative to the first structures 402a-402d. This shift or overlay error may be correlated with SRAF fidelity. For instance, if the shift is greater than a predetermined value, it may be determined that the SRAFs have failed and the corresponding product devices will likely fail. Otherwise, it is determined that the SRAFs have functioned within specification and the corresponding product devices will likely not fail.

A proxy target may also be formed to monitor phase error or pitch walk. Several embodiments of suitable targets and techniques for monitoring this effect are further described in co-pending U.S. patent application Ser. No. 10/423,827, entitled "METHOD AND MARK FOR METROLOGY OF PHASE ERRORS ON PHASE SHIFT MASKS", filed 25 Apr. 2003 by Michael Adel et al., which application is incorporated herein by reference in its entirety for all purposes. In general, a phase shift mask in formed from a plurality of opaque patterns and a plurality of etched clear portions, where some of the etched clear portions of the mask have different depths. The different depths of the mask's clear portions will result in differently phased portions of the light going through these clear portions. Some of these phase differences are designed to be 180 degrees out of phase from each other and therefore, cancel each other so the beams do not expose the underlying photoresist in particular areas. These different depths of the mask are generally designed to result in a more dense pattern on the photoresist than the pattern on the mask itself. However, if the clear portions or opaque portions of the mask are misaligned or shaped, this discrepancy can result in some beams not being 180 degrees out of phase, as they are expected to be. Thus, the printed structures may be incorrectly printed and not correspond to the designer's intent. One typical error is that the pitch of the printed structures becomes more or less dense then the intended pitch.

Proxy structures are designed to monitor these phase errors and the resulting errors in the printed feature pitch, feature position or feature shape. In one embodiment, the trim mask is utilized. The trim mask is typically used with a phase shift mask to block out unwanted portions of the beam which result from the phase shift. For instance, an unwanted line may result from interference in particular portions of the light that pass through the phase shift mask. A proxy target is formed by using the trim mask to block particular structures from being printed in a first area of the target. For example, alternating line structures may be blocked. The trim mask also blocks structures from being printed in a second area of target, and the second area blocking differs from the first area blocking so that the printed structures actually indicate the amount of phase shift error when measured or analyzed.

In the above examples, a COS was determined for both a process robust set of structures and a set of proxy structures that was composed of repeating (or non-printing) unresolvable substructures. In alternative techniques, a center of mass may be determined for each set of structures and compared to determine whether a produce feature characteristic (or process parameter) is likely to be out of specification and result in a faulty device. In another alternative approach, a periodic array of structures are formed from unresolvable substructures. A harmonic analysis is then performed on the periodic array. For instance, an image of the periodic array is obtained. One technique is to perform a Fourier decomposition on the periodic array and quantify the amplitudes of the Fourier components. If those Fourier components do not remain within a predetermined range of values, then it is determined that the corresponding product feature is likely to be out of specification and result in one or more faulty devices. This technique produces a result that corresponds to the amount of displacement or amount of shape change of the proxy periodic array with respect to its intended placement or shape.

Figure 5A:
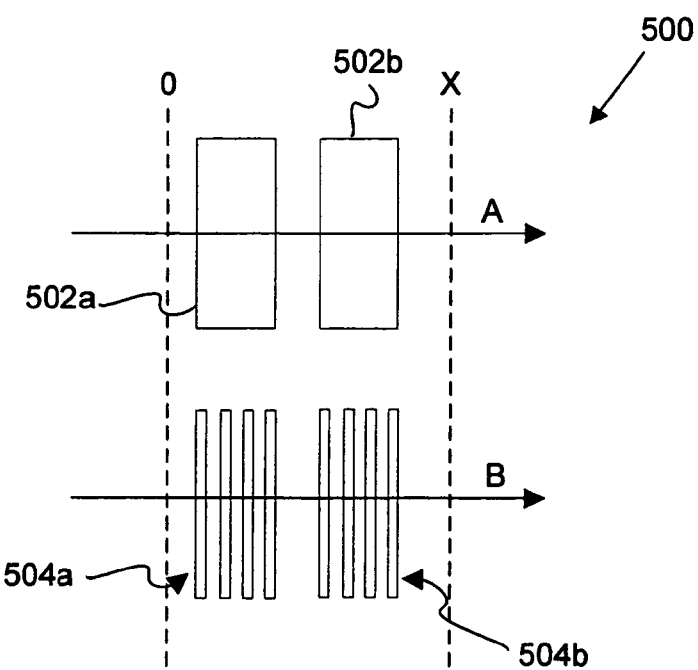
FIG. 5A illustrates a proxy target and use of a harmonic analysis technique on such proxy target in accordance with an alternative embodiment of the present invention.
Figure 5B:
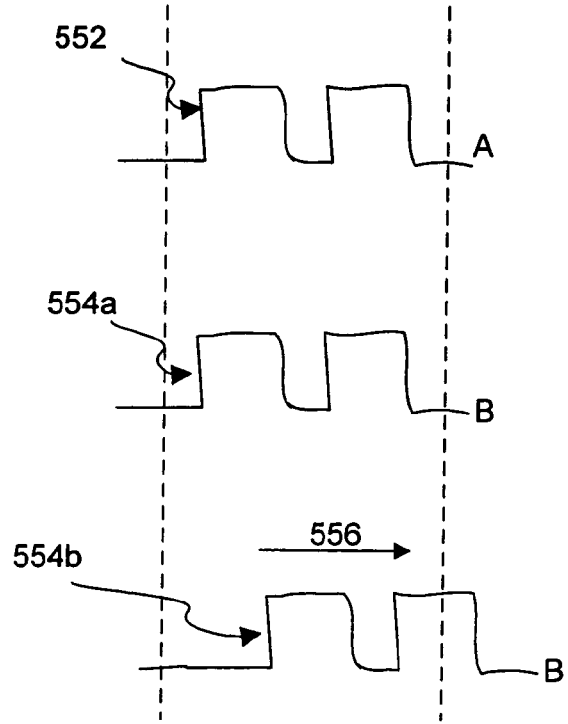
FIG. 5B illustrates use of a harmonic analysis technique on the proxy target of FIG. 5A in accordance with an alternative embodiment of the present invention.

FIG. 5A illustrates a proxy target 500 and FIG. 5B illustrates use of a harmonic analysis technique on such proxy target in accordance with an alternative embodiment of the present invention. As shown, the proxy target 500 includes only two sets of structures 502 and 504 although any number of sets may be utilized. The first set of structures 502 includes a pair of process robust structures 502a and 502b which are each resolvable with the optical tool. The second set of structures 504 are formed from two sets of periodic substructures 504a and 504b, where each substructure is not individually resolvable with the optical tool. The periodic substructures may correspond to periodic product structures, such as SRAM structures, and be sized to match the periodic product structures.

FIG. 5B illustrates the results of taking an image of the first set of structures 502 of FIG. 5A and collapsing them into a one-dimensional line A and performing the same collapsing function on the second set of structures 504 along a one-dimensional line B. As shown in FIG. 5B, when the two sets of structures have a substantially same overall shape and position with respect to each other, a one-dimensional diffraction signal 552 is obtained for the first set of structures 502 and a one-dimensional diffraction signal 554a is obtained for the second set of structures, by way of example.

Each diffraction signal is then converted into a moment function that depends on position on the proxy target. For instance, a center of mass function (COM) is obtained by the following equation:

$$COM = \int (\text{Intensity} \times \text{Location})$$

The integral is taken from position 0 to position X. Alternatively, another moment equation may be used, such as $I^2$ or $I^3$ as a function of position. The rotation of the wafer with respect to the target may also be calibrated out of the results. Although the center of symmetry technique described above is not sensitive to rotation, it is also not as sensitive to changes in structure shape as the harmonic analysis technique.

These moment techniques are especially sensitive to changes in shape and position. Thus, when the first and second set of structures have a substantially same shape and position relative to each other, a same value is obtained when a moment equation is applied to the two collapsed diffraction signals, e.g., 552 and 554a. However, when the periodic structures print incorrectly, they may shift in position and result in a shift in the diffraction signal. Diffraction signal 554b illustrates a shift in direction 556 of the second set of periodic structures 504. A change in shape would also result in a significant difference in the diffraction signal. One may select an appropriate moment function that is most sensitive to shape and position changes for the particular type of proxy structures.

Figure 6A:
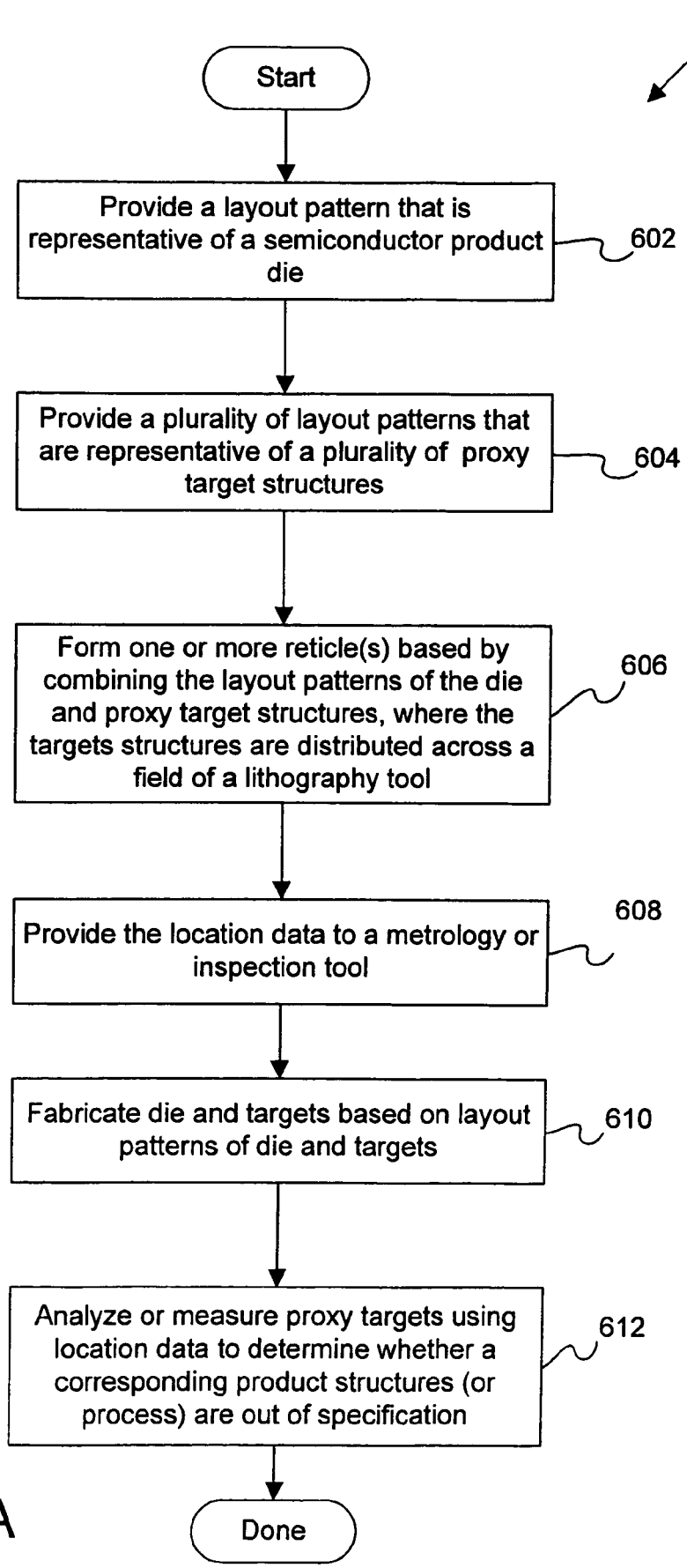
FIG. 6A is a flowchart illustrating a procedure for forming a plurality of die and targets in accordance with one embodiment of the present invention.

FIG. 6A is a flowchart illustrating a procedure 600 for forming a plurality of die and proxy targets in accordance with one embodiment of the present invention. Initially, a layout pattern that is representative of a semiconductor product die is provided in operation 602. A plurality of layout patterns that are representative of a plurality of proxy target structures is then also provided in operation 604. Any number of type of proxy structures, such as the proxy targets described above, may be utilized.

An integrated circuit (IC) device and proxy target structure may be designed using any suitable design techniques. For example, an IC designer may use preexisting schematic library blocks to form the IC device and targets using, for example, electronic design automation (EDA) tools. In some cases, the IC designer may create an entire IC device target or part of an IC device or target from scratch with the aid of any suitable design system, such as conventional computer aided design (CAD) tools. For example, the IC designer may use a schematic CAD tool to plan the logic diagrams for a particular IC device or proxy target. Still further, the IC designer may write a description of the IC device or target or portions of the IC device or proxy target with the aid of a hardware design language, such as VHDL.

The IC designer then typically generates a layout pattern from the IC circuit design. The layout pattern may be composed of a plurality of electronic representations of IC layers that are later converted into a plurality of reticles that are used to fabricate a plurality of physical layers of an IC device and target. Each physical layer of the fabricated IC device corresponds to one of the reticles and an associated one of the electronic representations from the layout pattern. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. The proxy targets may be formed from any combination of one or more layers. For example, a special layer may be reserved for the proxy target structures, or the proxy targets may be formed from the dummy layer. Each electronic representation is composed of a plurality of polygons or other shapes (herein, referred to as "figures"), which together define the layout or reticle pattern.

The layout pattern may be generated using any suitable technique, for example, by using EDA or CAD tools. For example, the IC designer may manually lay out the layout patterns for the IC device and targets with or without preexisting library cells. Alternatively, a synthesis tool may automatically create layout patterns for the IC device and targets from scratch or by piecing together preexisting library cells based on the schematic design.

One or more reticles are then formed based on combining the layout patterns of the die and proxy target structures in operation 606. In one or more of the reticles, the target structures are distributed across a field of a lithography or scanner tool in operation 606. For instance, a plurality of targets are distributed within a street of the wafer so as to be distributed across a field. Preferably, the proxy targets are placed within a street which runs through the center of the field. Alternatively, a plurality of proxy target structures may be distributed within the die areas themselves. Placement across the field or within the die area allows the targets to better approximate the effects of process changes on actual device structures.

The reticles are produced using the layout patterns. Each reticle corresponds to one or more electronic representation(s) from the circuit pattern database. The reticles may be produced by any suitable pattern generator or reticle writer equipment, such as a MEBES 4500, commercially available from ETEC of Hayward, Calif.

The location data for each target structure may be provided to a metrology or inspection tool in operation 608. This information transfer may occur at any point within the process flow prior to one or more inspection or metrology stage(s). The location of a particular proxy target may be stored in any suitable format for identifying a position of the particular proxy target. For example, the location may take the form of Cartesian or polar coordinates. Identity data may also be provided to the metrology or inspection too and is generally used to distinguish between different types of targets. It may take the form of alphanumeric text which identifies the type of target, such as overlay, CD, etc., or the identity may take the form of a reference to a target image.

The location data may be provided directly or indirectly through another entity, such as a database or controller. That is, the location data may be output by the CAD module and input or uploaded into a particular inspection or metrology tool. Alternatively, the location data may be stored within the fabrication database which is accessible by the various process, inspection, review, and metrology tools. The location data may be stored in a format that is readable or accessible by a particular inspection, review, or metrology tool. For example, the location data may be in OpenAccess format, which is readable by inspection and metrology tools from KLA-Tencor.

The die and proxy targets are then fabricated based on the formed reticle in operation 610, and the proxy targets may then be measured or inspected using the location data in operation 612. That is, the inventive techniques described herein are used to determine whether an unresolvable structure of the proxy target has changed its shape or position. When a change in shape or position has been detected, it may then be determined whether the amount of change means that the unresolvable structure is outside specification bounds or is likely to result in a faulty device, e.g., be yield limiting.

The results of this analysis may then be used to optimize the photolithography tool so that it is optimized for a given feature corresponding to the proxy target and lithography process. The results may also be used to monitor the lithography tool's performance and to initiate trouble shooting tasks when a proxy target analysis indicates that there is a problem with a feature's shape or location. Additionally, the results may be used to monitor or control the process that is being used to fabricate the proxy target under test, as well as lot dispositioning. For instance, analysis of changes in the proxy structures may indicate that the wafer lot is out of specification or that the process needs to be altered. The wafer lot may be reworked or thrown out.

The proxy targets may be inspected or measured at any one or more times within the fabrication process. Any suitable inspection or metrology tool may be utilized during any stage of the fabrication. Each tool may take the form of an optical system, such as a bright field or dark field optical system. The tool may also utilize both bright field and dark field modes. Examples of bright field systems include the 2350, 2351, 2360, and 2370 from KLA-Tencor, Corp. of San Jose, Calif. Examples of dark field system include the AIT II, AIT XP, Fusion, Fusion UV, and SP1 PatternPro available from KLA-Tencor, Corp. of San Jose, Calif. The KLA 301 or 351 Reticle Inspection Tool may be used to inspect reticles. Each tool may also be stand alone or integrated within a processing tool.

Figure 6B:
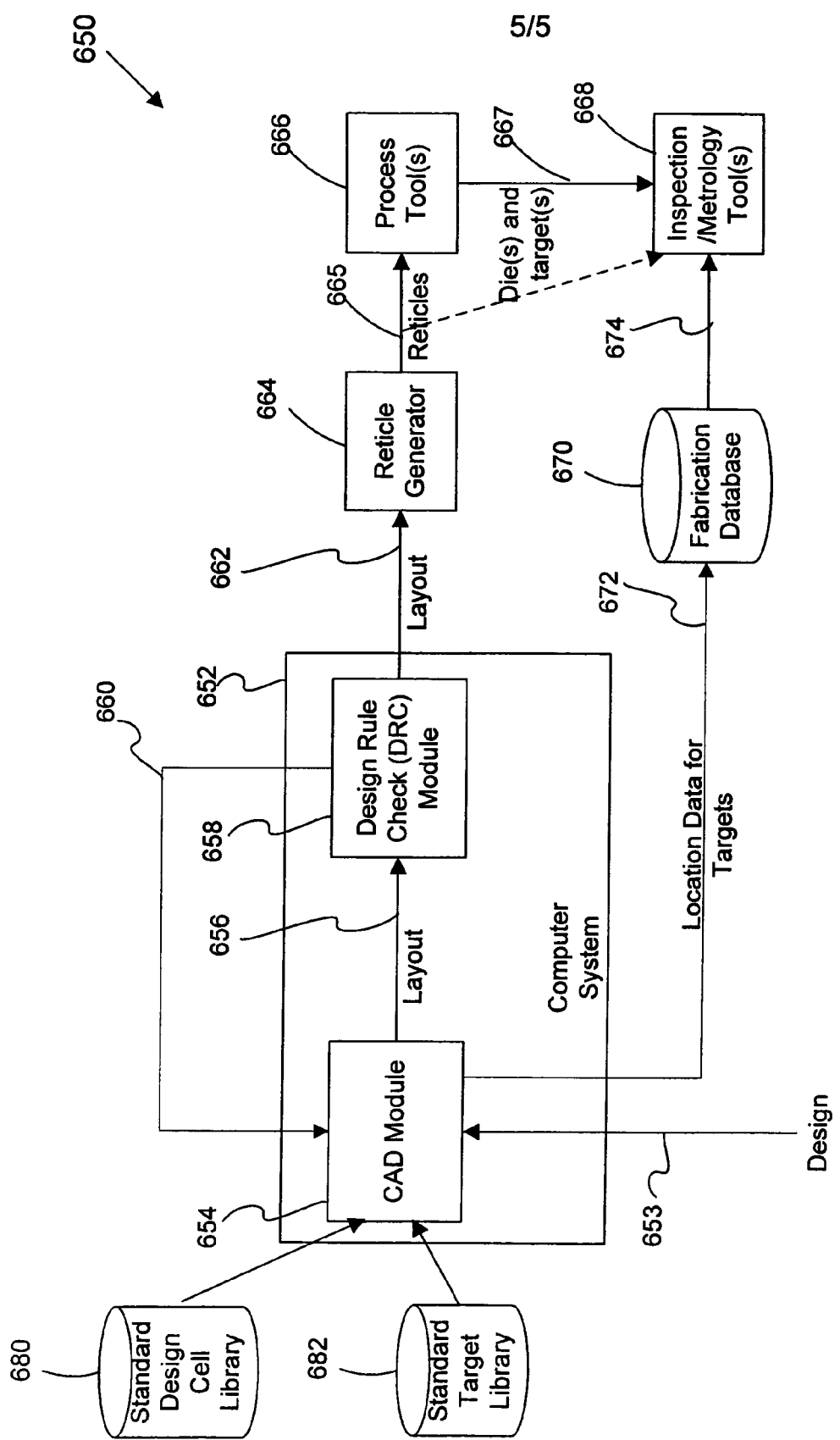
FIG. 6B is a diagrammatic representation of a design, fabrication, and metrology or inspection system in accordance with one embodiment of the present invention.

FIG. 6B is a diagrammatic representation of a design, fabrication, and metrology or inspection system 650 in accordance with one embodiment of the present invention. As shown, a design 653 of a die and targets is input into a computer aided design (CAD) module 654. This CAD module 654 may also have access to one or more databases containing standard layout patterns. In the illustrated embodiment, a standard design cell library 680 includes layout patterns for features within the active regions of the die and a standard target library 682 includes a number of different standard target layout patterns.

The CAD module 654 is generally configured to generate a layout pattern either automatically or via input from a design engineer. Several suitable CAD products for designing IC products are available from Cadence of San Jose, Calif. and Mentor Graphics of Wilsonville, Oreg. The layout pattern 656 is then checked by a design rule check (DRC) module 658. The DRC module is generally configured to determine whether the layout 656 conforms to a set of layout constraints. A feedback pathway 660 is provided to CAD module 654 for modification of the layout pattern 656 when the layout pattern fails to conform to the DRC. For example, the DRC module may indicate a number of nonconforming layout regions which may then be modified to comply with the design rules. As shown, the CAD module and DRC module are contained within the same computer system 652. Of course, the CAD module and DRC module may be implemented in any suitable combination of hardware and software.

After the layout pattern is determined to conform to the design rules by the DRC module 658, the layout pattern 662 is passed to a reticle generator 664 in a form that is readable by the radical generator. For example, the layout may be in a GDSII format. The reticle generator then forms a plurality of reticles 665 based on the layout pattern 662. The reticles may then be used by one or more process tools 666 to at least partially fabricate one or more die(s) and integrated targets 667. With regards to forming the targets and die, the targets are generally patterned on the product wafer using suitable photolithographic techniques. In the simplest case, the targets are formed within a photoresist layer on the test wafer (e.g., resist/resist wafer). Alternatively, the targets may be formed in other layers such as dielectric or metal layers.

The resulting the die(s) and targets (e.g., formed on the product wafer) may then be provided to one or more inspections or metrology tools 668 so that the targets may be inspected or measured. Of course, the reticle targets 665 themselves may be inspected or measured. With regards to measuring the targets, the overlay measurements may be performed using a variety of methods and metrology tools. For example, they may be performed using imaging, scanning, scatterometry and the like. Thus, inspection or metrology results are obtained from one or more proxy targets which are distributed across the field.

Location data 672 for each proxy target is also provided to the inspection or metrology tools 668 so that the proxy targets may be found by the tool. In one specific embodiment, the location data 674 is retained in fabrication database 670, which is accessible by the inspection or metrology tools 668. Alternatively, the location data may be directly provided or transferred to the inspection or metrology tools 668.

Although the foregoing invention has been described in some detail for purposes of clarity of understanding, it will be apparent that certain changes and modifications may be practiced within the scope of the appended claims. For example, the above described proxy targets may be monitored in any stage of fabrication, such as after the photoresist is patterned or after the material underlying the photoresist is patterned. Additionally, although the above techniques and targets are described as being applied to product reticles or wafers, of course the techniques and targets may be applied to any suitable type of specimen such as test retcles or wafers. Therefore, the described embodiments should be taken as illustrative and not restrictive, and the invention should not be limited to the details given herein but should be defined by the following claims and their full scope of equivalents.

What is claimed is:

1. A method of monitoring a characteristic associated with a product feature on a semiconductor product, the method comprising:

providing a proxy target formed from at least one substructure that corresponds to a product feature, wherein the substructure is not individually resolvable by an optical tool;

determining a characteristic of the proxy target based on optically monitoring the proxy target using the optical tool, wherein the characteristic of the proxy target is an amount of overlay error that is present between two sets of structures of the proxy target; and based on the determined characteristic of the proxy target, determining whether the corresponding product feature has a characteristic that is a line shortening effect that is within a predetermined specification, wherein it is determined whether the line shortening effect is within a predetermined specification when the overlay error determined for the proxy target is not within a predetermined specification, wherein the predetermined specification of the line shortening effect corresponds to whether the corresponding product feature will likely result in a faulty device that decreases yield, wherein the proxy target comprises a first set of anchor structures that have shape and position characteristics that remain substantially the same when a process for fabricating the proxy target changes and a second set of structures that are sensitive to line shortening.

2. A method as recited in claim 1, wherein the characteristic of the proxy target is obtained from performing a scatterometry technique on an optical signal emanating from the proxy target.

3. A method as recited in claim 1, wherein the characteristic of the proxy target is obtained from an optical image of the proxy target.

4. A method as recited in claim 1, wherein the characteristic of the corresponding product feature further includes a shape parameter and a position parameter.

5. A method as recited in claim 1, wherein the second set of structures each includes a plurality of periodic lines that are not individually resolvable with the optical tool and wherein each structure that is composed of periodic lines of the second set is resolvable by the optical tool, wherein line shortening in any of the periodic lines affects the determined overlay error of the proxy target.

6. A method as recited in claim 5, wherein the second set of structures each further include a wide bar that is resolvable and is coupled to a first end of the periodic lines.

7. A method of monitoring a characteristic associated with a product feature on a semiconductor product, the method comprising:

providing a proxy target formed from at least one substructure that corresponds to a product feature, wherein the substructure is not individually resolvable by an optical tool;

determining a characteristic of the proxy target based on optically monitoring the proxy target using the optical tool; and based on the determined characteristic of the proxy target, determining whether the corresponding product feature has a characteristic that is within a predetermined specification or whether a process parameter used to fabricate such product feature is within a predetermined specification, wherein the characteristic of the proxy target is an amount of shift that is present between two sets of structures of an image of the proxy target, and wherein the characteristic of the corresponding product feature is a pattern placement error, wherein it is determined whether the pattern placement error is within a predetermined specification when the shift amount determined for the proxy target is not within a predetermined specification, wherein the predetermined specification of the pattern placement error corresponds to whether the corresponding product feature will likely result in a faulty device that decreases yield, wherein the proxy target comprises a first set of anchor structures that have shape and position characteristics that remain substantially the same when a process for fabricating the proxy target changes and a second set of structures that are sensitive to pattern placement error.

8. A method as recited in claim 7, wherein the second set of structures each includes a plurality of periodic lines that are not individually resolvable with the optical tool and wherein each structure that is composed of periodic lines of the second set is resolvable by the optical tool, wherein pattern placement error in any of the periodic lines affects the determined shift amount of the proxy target.

9. A method of monitoring a characteristic associated with a product feature on a semiconductor product, the method comprising:

providing a proxy target formed from at least one substructure that corresponds to a product feature, wherein the substructure is not individually resolvable by an optical tool;

determining a characteristic of the proxy target based on optically monitoring the proxy target using the optical tool, wherein the characteristic of the proxy target is an amount of overlay error that is present between two sets of structures of the proxy target; and based on the determined characteristic of the proxy target, determining whether the corresponding product feature has a characteristic that is a subresolution assist structure characteristic that is within a predetermined specification, wherein it is determined whether the subresolution assist structure characteristic is within a predetermined specification when the overlay error determined for the proxy target is not within a predetermined specification, wherein the predetermined specification of the subresolution assist structure characteristic corresponds to whether the corresponding product feature will likely result in a faulty device that decreases yield.

10. A method as recited in claim 9, wherein the proxy target comprising a first set of anchor structures that have shape and position characteristics that remain substantially the same when a process for fabricating the proxy target changes and a second set of structures that are sensitive to a subresolution assist structure error.

11. A method as recited in claim 10, wherein the second set of structures each includes a plurality of periodic lines and a subresolution assist structure that is designed to only be present in a reticle but not a printed proxy target and wherein each structure that is composed of periodic lines of the second set is resolvable by the optical tool, wherein a subresolution assist structure error in any of the periodic lines affects the determined overlay error amount of the proxy target.

12. A method of monitoring a characteristic associated with a product feature on a semiconductor product, the method comprising:
    providing a proxy target formed from at least one substructure that corresponds to a product feature, wherein the substructure is not individually resolvable by an optical tool;
    determining a characteristic of the proxy target based on optically monitoring the proxy target using the optical tool; and
    based on the determined characteristic of the proxy target, determining whether the corresponding product feature has a characteristic that is within a predetermined specification or whether a process parameter used to fabricate such product feature is within a predetermined specification,
    wherein the characteristic of the proxy target is a value obtained from a harmonic analysis of at least a first and a second set of structures on an image of the proxy target and wherein the proxy target comprises a first set of anchor structures that have shape and position characteristics that remain substantially the same when a process for fabricating the proxy target changes and a second set of structures that are formed from one or more substructures that are not resolvable with the optical tool and where changes in a shape or position of any substructure results in a change to the characteristic of the proxy target.

13. A method as recited in claim 12, wherein the value obtained from a harmonic analysis is obtained by collapsing an image of the first set of structures into a first one-dimensional line and obtaining a first value for such first one-dimensional line, collapsing an image of the second set of structures into a second one-dimensional line and obtaining a second value for such second one-dimensional line, and then obtaining a difference value between the first and second values.

14. A method as recited in claim 13, wherein the first value and the second value correspond to moment functions for the first and second one-dimensional lines, respectively.

* * * * *